(12) United States Patent
Yokokawa et al.

(10) Patent No.: US 6,566,233 B2
(45) Date of Patent: May 20, 2003

(54) METHOD FOR MANUFACTURING BONDED WAFER

(75) Inventors: Isao Yokokawa, Gunma-ken (JP); Kiyoshi Mitani, Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/926,049

(22) PCT Filed: Dec. 18, 2000

(86) PCT No.: PCT/JP00/08945

§ 371 (c)(1),
(2), (4) Date: Aug. 21, 2001

(87) PCT Pub. No.: WO01/48825

PCT Pub. Date: Jul. 5, 2001

(65) Prior Publication Data

US 2003/0040163 A1 Feb. 27, 2003

(30) Foreign Application Priority Data

Dec. 24, 1999  (JP) .............................. 11-368400

(51) Int. Cl.[7] ............................................... H01L 21/46
(52) U.S. Cl. ...................... 438/455; 438/456; 438/457; 438/458
(58) Field of Search .................. 438/455, 458, 438/459, 406, 506, 509, 528; 257/59, 60, 61, 62, 347

(56) References Cited

U.S. PATENT DOCUMENTS

| | | | |
|---|---|---|---|
| 5,374,564 A | * 12/1994 | Bruel | 438/455 |
| 5,882,987 A | 3/1999 | Srikrishnan | |
| 6,146,979 A | * 11/2000 | Henley et al. | 438/458 |
| 6,251,754 B1 | * 6/2001 | Ohshima et al. | 438/506 |
| 6,294,814 B1 | * 9/2001 | Henley et al. | 257/347 |
| 6,323,108 B1 | * 11/2001 | Kub et al. | 438/458 |

FOREIGN PATENT DOCUMENTS

| | | |
|---|---|---|
| EP | 0851465 | 7/1998 |
| EP | 0898307 | 2/1999 |
| FR | 2756847 | 6/1998 |
| FR | 2767604 | 2/1999 |
| JP | 60-50970 | 3/1985 |
| JP | 5-46086 | 7/1993 |
| JP | 5-211128 | 8/1993 |
| JP | 9-213916 | 8/1997 |
| JP | 10189474 | 7/1998 |
| JP | 11121310 | 4/1999 |
| JP | 11121377 | 4/1999 |
| JP | 11154652 | 6/1999 |
| JP | 11307471 | 11/1999 |

OTHER PUBLICATIONS

English Language Abstract of JP 60–50970.
English Language Abstract of JP 5–211128.
English Language Abstract of JP 10–189474.
English Language Abstract of JP 11–307471.
English Language Abstract of JP 11–121310.
English Language Abstract of JP 9–213916.
English Language Abstract of JP 11–154652.
English Language Abstract of JP 11–121377.

* cited by examiner

Primary Examiner—David Nelms
Assistant Examiner—Dung A Le
(74) Attorney, Agent, or Firm—Greenblum & Bernstein, P.L.C.

(57) ABSTRACT

A method for manufacturing a bonded wafer, in which when a bonded wafer is manufactured using an ion implantation separation method, impurities attached in the ion implantation step can be removed effectively, and less failure called a void is generated on the bonding surface.

Impurities such as particles or organic substances attached in ion implantation step (c) are removed using a physical removal method (d). The surface of a first wafer (1) subjected to impurities removal is closely contacted onto the surface of a second wafer (2) for heat treatment (e). The first wafer is separated in a thin-film form at a micro bubble layer (f).

8 Claims, 1 Drawing Sheet

METHOD FOR MANUFACTURING BONDED WAFER

TECHNICAL FIELD

The present invention relates to a so-called ion implantation separation method in which a wafer to which hydrogen or rare gas ions are implanted, is separated after heat treatment to manufacture a bonded wafer, more specifically, to a method for manufacturing a bonded SOI wafer which causes, on the bonding surface, less bonding failure called a void.

CONVENTIONAL ART

As a method for manufacturing a bonded SOI (Silicon On Insulator) wafer using a bonding method, there has conventionally been known a technique for bonding two silicon wafers together via a silicon oxide film, for example, as disclosed in Japanese Patent Publication No. Hei 5-46086, a method in which an oxide film is formed on at least one of the two wafers, the wafers are closely contact with each other so as not to contain any foreign matters between the surfaces to be bonded, and they are subjected to a heat treatment at a temperature of 200 to 1200° C. to enhance the bonding strength.

The bonded wafer whose bonding strength is enhanced by performing heat treatment can be subjected to later grinding and polishing processes. The thickness of the element fabrication side wafer is reduced to a predetermined thickness by grinding and polishing to form an SOI layer for element forming.

A bonded SOI wafer produced as described above has advantages of excellent crystallinity of the SOI layer and high reliability of the produced buried oxide layer existing immediately below the SOI layer. However, because a thin film should be formed by grinding and polishing, the operation for producing the thin film takes time, and there are generated material loss. In addition, the uniformity of the film thickness obtained by this method is only in a level of the desired film thickness ±0.3 μm.

In recent years, with high-integration and high-speed of semiconductor devices, the thickness of the SOI layer must be made smaller and improve the film thickness uniformity. Specifically, the film thickness and the film thickness uniformity of about 0.1±0.01 μm are required.

In order that the thin film SOI wafer having such a film thickness and film thickness uniformity is realized by a bonded wafer, a process for reducing the thickness using conventional grinding and polishing is impossible. As a new thin-film technique, there is developed an ion implantation separation method disclosed in Japanese Laid-Open Patent Publication No. Hei 5-211128 or a method called a hydrogen ion separation method (also called a Smart Cut (trademark) method).

This hydrogen ion separation method is a technique that comprises forming an oxide film on at least one of two silicon wafers, implanting at least one of hydrogen ions or rare gas ions into one of the silicon wafers from its upper surface to form a fine bubble layer (enclosed layer) inside the silicon wafer, bringing the ion implanted surface into contact with the other wafer via the oxide film, then subjecting the wafers to a heat treatment (separation heat treatment) to separate one of the wafer as a thin film at the fine bubble layer as a cleavage plane (separating plane), and further subjecting them to a heat treatment (bonding heat treatment) for firmly bonding them to obtain an SOI wafer.

There has recently been also known a method for manufacturing an SOI wafer in which hydrogen ions are excited to perform ion implantation in a plasma state for separation at room temperature without adding a special heat treatment.

In this method, the cleavage plane is a good mirror surface, and an SOI wafer having an extremely high uniformity of the SOI layer can be obtained relatively easily. The thin-film wafer separated can also be reused, so that the material can be used effectively.

Further, in this method, silicon wafers can be directly bonded together without interposing an oxide film. This method is used not only in the case of bonding the silicon wafers together, but also in the case of implanting ions to a silicon wafer to be bonded to an insulator wafer such as quartz, silicon carbide, and alumina having different thermal expansion coefficients, or in the case of implanting ions to an insulator wafer to be bonded to other wafer, thereby manufacturing a wafer having these thin films.

When manufacturing a bonded wafer using the ion implantation separation method, organic substances or particles attached in the ion implantation step cause, in the bonding interface, bonding failure called a void. Usually, a wafer to which ions are implanted is subjected to RCA cleaning or organic-substance removing and cleaning, and then, is bonded to the other wafer. The RCA cleaning is a typical cleaning method in the semiconductor process, based on two kinds of cleaning solutions of SC-1 ($NH_4OH/H_2O_2/H_2O$ mixture) and SC-2 ($HCl/H_2O_2/H_2O$ mixture), and can remove impurities such as particles, organic substances, or metal contaminants.

When a wafer to which ions are implanted is cleaned using the conventional cleaning method as described above to manufacture a bonded wafer, the void generation rate cannot be always reduced to a level satisfied. In particular, when no voids are observed immediately after bonding or after separation heat treatment, voids of small size (below 1 mm) observed after bonding heat treatment or a step called touch polish for slightly polishing the separated surface after bonding heat treatment may be generated. The reduction thereof has been required.

DISCLOSURE OF THE INVENTION

The present inventors have examined in detail a void generated through the usual cleaning step as described above. Consequently, it is apparent that a void tends to generate in the case that impurities such as particles or organic substances attached in the ion implantation step remain without being removed by the conventional chemical cleaning or the wafer surface becomes rough by ion implantation. To remove any impurities such as remaining particles or surface roughness, the present invention has been completed by conceiving use of a physical removing method.

As s specific method for physically removing impurities, for example, CMP can be used. The CMP polishing physically scrapes impurities such as particles or organic substances present on the surface to which ions are implanted and cannot be removed by chemical cleaning, and can improve surface roughness caused in the ion implantation step, thereby removing of void generation.

"CMP" in the present invention will be defined herein.

One of recent device process techniques emphasized is a technique called CMP (Chemical and Mechanical Polishing). A CMP technique in a broad meaning is not a new technique and has been long used in mirror polishing for silicon wafers as typical chemical and mechanical polishing. On the other hand, CMP in a narrow meaning which has been focused on recently is one kind of a flattening technique in device process, and is typically a technique composed mainly of a physical flattening technique for flattening an interlayer insulator film such as oxide film or a metal film such as wiring. When CMP is simply described in the present invention, it will represent the CMP in a narrow meaning.

BEST MODE FOR CARRYING OUT THE INVENTION

Figure 1A:
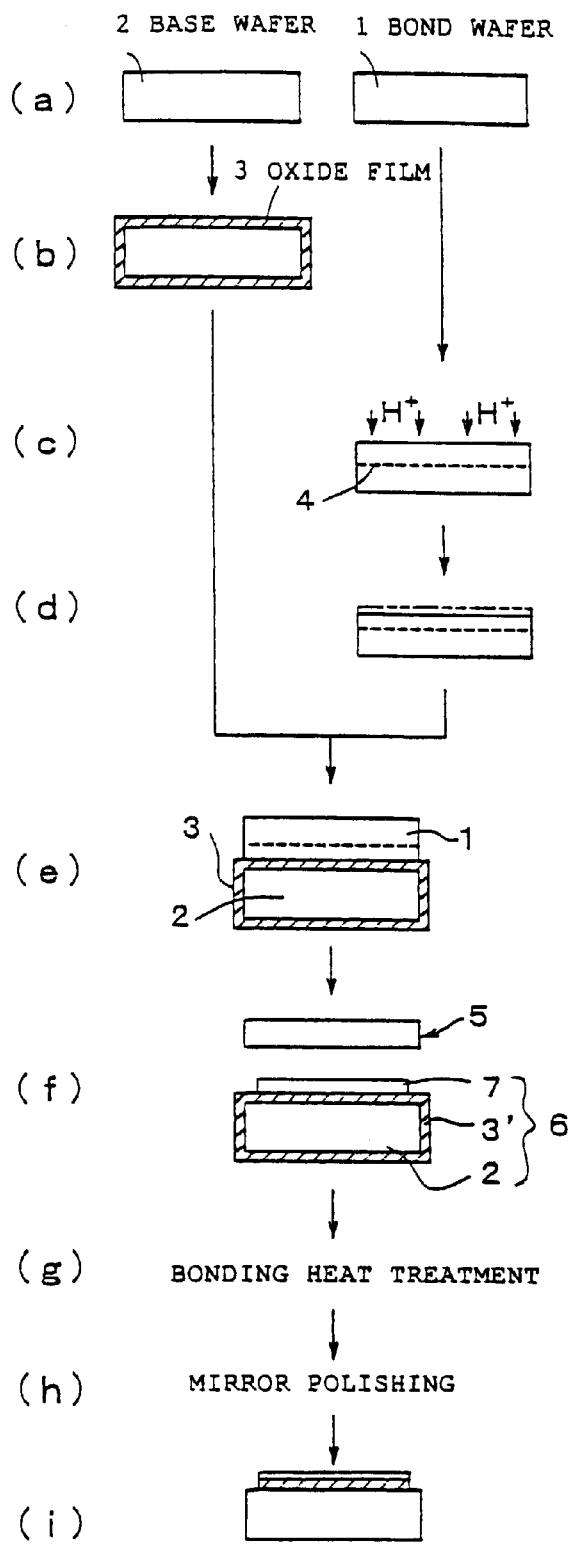
FIGS. 1(A) and 1(B) are flowcharts showing one example of a method for manufacturing a bonded SOI wafer according to the present invention and are respectively, a method performed by forming an oxide film only at a base wafer side to which ions are not implanted, and a method for performing ion implantation after an oxide film is formed on a bond wafer.

To describe the present invention in greater detail, an example in which silicon wafers are bonded together to manufacture an SOI wafer will be described with reference to FIGS. 1(A) and 1(B). However, the present invention is not limited to this.

In step (a), two silicon wafers 1, 2 are prepared and are silicon single crystal wafers each at least having a surface to be bonded being subjected to mirror polishing. The numeral 1 denotes a bond wafer (a first wafer), and the numeral 2 denotes a base wafer (a second wafer).

In step (b), any one of the two silicon wafers 1, 2 is formed with an oxide film 3. The oxide film becomes a buried oxide layer of an SOI wafer, and the thickness thereof is set according to application.

In step (c), ions are implanted to the bond wafer 1 as an SOI layer. At least one of hydrogen ions or rare gas ions, here, hydrogen ions are implanted from the top surface of one of the surfaces of the bond wafer 1 (the surface to be bonded to the base wafer 2) to form a micro bubble layer (an enclosing layer) 4 in parallel with the surface at the average penetration depth of the ion. The wafer temperature during the implantation is preferably below 450° C., more preferably below 200° C. The implantation energy is suitably determined by the targeted thickness of the SOI layer of an SOI wafer to be manufactured. When ions are implanted to a bare silicon not formed with the oxide film on the surface, ions are preferably implanted at a slightly tilted implantation angle so as not to be in parallel with the crystal axis of the bond wafer 1 to prevent channeling effect.

After the step (c), conventionally, the both wafers 1, 2 passed through the cleaning step (the chemical cleaning method) are bonded together. The present invention, as a surface treatment before bonding, performs impurities removing process (d) for removing impurities attached onto the bond wafer 1 surface to which ions are implanted. A physical method is used as the impurities removing process (d). Specifically, examples thereof include usual chemical and mechanical polishing provided with both physical removal and chemical removal, CMP composed mainly of physical removal, and brush cleaning, and can be used in combination with the conventional chemical cleaning method. In the case of performing chemical cleaning after the physical removal, the impurities removing effect by the physical removing step can give sufficient cleaning effect when chemical liquid concentration of chemical cleaning is lowered than usual. The surface roughness of the wafer surface by chemical cleaning can be reduced, and the cost required for manufacturing cleaning liquid can also be reduced.

In the typical CMP, for example, hard foamed polyurethane and the like can be used as polishing cloth, and fumed silica with alkali such as potassium hydroxide or ammonia added can be used as polishing slurry. Brush cleaning is a method for scrubbing and cleaning the wafer surface by means of a brush (the material is, for example, polyvinyl alcohol) while flowing pure water or aqueous alkali solution onto.

Figure 1B:
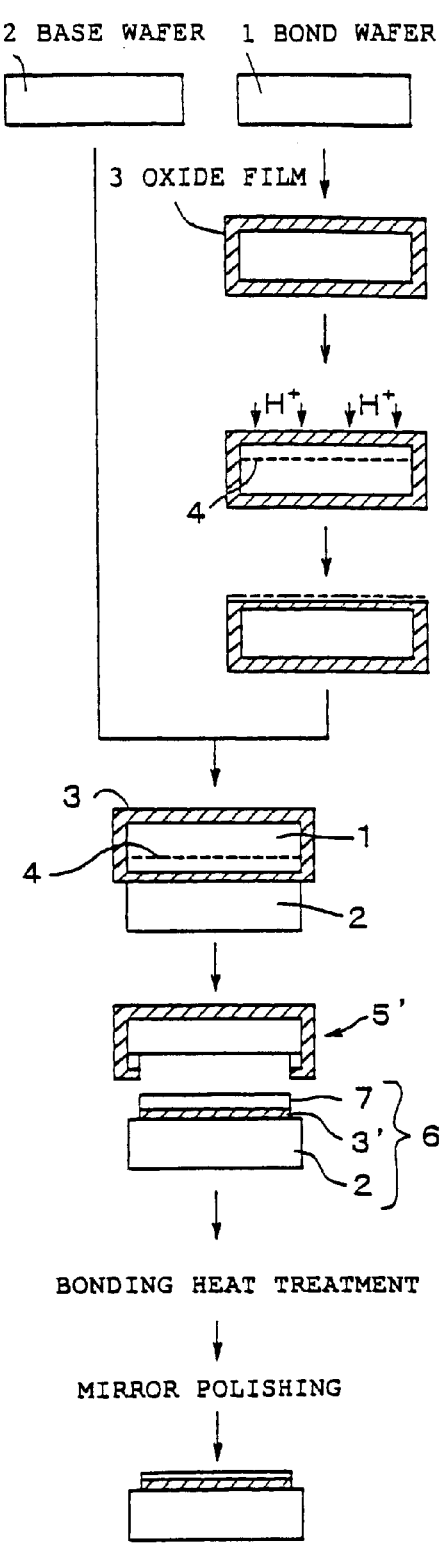

Such a method for physically removing particles attached onto a wafer surface is applicable irrespective of whether the surface is a silicon surface (the flow in FIG. 1(A)) or an oxide film surface (the flow in FIG. 1(B)) to remove a void generation source very effectively. In particular, CMP physically scrapes the underlayer silicon or oxide film together with contaminants such as particles on the wafer surface. It is possible to improve surface roughness caused in the ion implantation step.

In step (e), the wafer surface to which ions are implanted is subjected to the impurities removing process (d) by physical process such as CMP, and then, the other wafer 2 (the base wafer) is superposed and closely contacted thereonto. The surfaces of the two wafers are contacted with each other at room temperature under clean atmosphere, so that the wafers are joined together without using an adhesive. In this case, the other wafer 2 (the base wafer) in the flow in FIG. 1(B) may be formed with an oxide film on the surface as needed.

Step (f) is a separation heat treatment process in which the joined wafer is separated at the enclosing layer formed by ion implantation as boundary to be isolated into a separated wafer 5 and an SOI wafer 6 (SOI layer 7+buried oxide layer 3'+base wafer 2). The joined wafer is subjected to heat treatment under an rare gas atmosphere or an oxidizing gas atmosphere at about temperatures of 400 to 600° C., so as to be isolated into the separated wafer 5 and the SOI wafer 6 by the crystal rearrangement and bubble coagulation. At the same time, the contact surface can be bonded strongly to some extent at room temperature. The separated wafers 5, 5' in the flows in FIGS. 1(A) and 1(B) can be reused by performing, as needed, a reclaim process for removing the oxide film on the surface and polishing the separated surface.

To use the SOI wafer 6 in the device manufacturing step, the bonding force by the separation heat treatment of the step (f) is not sufficient. The SOI wafer 6 is subjected to heat treatment at high temperature as the bonding heat treatment of step (g) so as to sufficiently enhance the bonding strength. The heat treatment can be performed, for example, under an rare gas atmosphere or an oxidizing gas atmosphere at temperatures within a range of 1000 to 1200° C. and for about 30 minutes to 5 hours. A rapid heating and rapid cooling apparatus such as lamp heater is used to give sufficient bonding strength at temperatures of 1000 to 1350° C. for a short time of about 1 to 300 seconds.

When the bonding heat treatment of the step (g) serves as the separation heat treatment of the step (f), the step (f) nay be omitted.

Step (h) is a mirror polishing step for removing a damage layer and surface roughness present in the cleavage plane (the separated surface) as the surface of the SOI layer. This step can perform polishing called touch polish with very small amount of polishing stock removal, and add heat treatment under a reducing atmosphere including hydrogen after touch polish. When only heat treatment is performed under the reducing atmosphere including hydrogen without performing touch polish, the damage layer and surface roughness can be removed and can serve as the bonding heat treatment of the step (g). The step (h) is more efficient.

From the above-mentioned steps, it is possible to manufacture a bonded SOI wafer with little generation of voids or no generation of voids.

The present invention is not limited to the above-mentioned embodiment. For example, the above-mentioned embodiment describes the process for manufacturing an SOI wafer by bonding two silicon wafers together through an oxide film using the ion implantation separation method. The present invention is applicable to another method for manufacturing a bonded wafer, that is, in the case that after ion implantation, silicon wafers are directly bonded together not through an oxide film, as well as in the case that ions are implanted to a silicon wafer, and the wafer is directly bonded to an insulator wafer such as $SiO_2$, $SiC$ and $Al_2O_3$, thereby manufacturing an SOI wafer.

The above-mentioned embodiment describes the case that in the hydrogen-ion separation method, the wafer is subjected to heat treatment to be separated. The present invention is also applicable to the hydrogen-ion implantation separation method in which hydrogen ions are excited to perform ion implantation in a plasma state, thereby separating the wafer at room temperature without performing a special heat treatment.

EXAMPLES

SOI wafers were manufactured under the following conditions to compare the states of voids generation.

TABLE 1

Examples and Comparative examples

|  | Example 1 | Example 2 | Comparative example 1 |
|---|---|---|---|
| Wafer to be used | Forty silicon single crystal wafers each (twenty bond wafers each and twenty base wafers each) having diameter 200 mm, thickness 725 $\mu$m, crystal axis orientation <100>, conductivity type p type, resistivity 10 to 20 $\Omega \cdot$ cm, and one of the surfaces subjected to mirror polishing | | |
| Manufacturing flow | FIG. 1(A) | FIG. 1(B) | FIG. 1(B) |
| Oxide film thickness in step (b) | 400 nm | 400 nm | 400 nm |
| Step (c) | 40 keV | 80 keV | 80 keV |
| $H^+$ ion implantation conditions | $8 \times 10^{16}$ atoms/cm$^2$ | $8 \times 10^{16}$ atoms/cm$^2$ | $8 \times 10^{16}$ atoms/cm$^2$ |
| Bond wafer surface treatment conditions | CMP Polishing portion 100 nm | CMP Polishing portion 100 nm | Organic-substance removing and cleaning + SC-1 + SC-2 |
| Separation heat treatment | Under a nitrogen gas atmosphere 500° C., 30 min | | |
| Bonding heat treatment | Under a nitrogen gas atmosphere 1100° C., 2 hr | | |
| Touch polish | Polishing stock removal 100 nm | | |
| Result of voids observed | 0 voids/wafer: 17 pieces  1 void/wafer: 2 pieces  2 voids/wafer: 1 piece | 0 voids/wafer: 16 pieces  1 void/wafer: 3 pieces  2 voids/wafer: 1 piece | 0 voids/wafer: 10 pieces  1 void/wafer: 6 pieces  2 voids/wafer: 3 pieces  3 voids or more: 1 piece |
| Void-free percentage | 85% | 80% | 50% |

<CMP>
Apparatus: MIRRA manufactured by Applied Materials, Inc.
<Void Observation>
Apparatus: Bright light 200 manufactured by Irvine Optical Corporation
Observation size: Void below 1 mm $\phi$
The void observed here is referred to as a portion having the bonding surface exposed after touch polish. No voids of a size exceeding 1 mm $\phi$ were not present on any wafers.
Effect of the Invention As described above, in the present invention, when a bonded wafer is manufactured by the ion implantation separation method, impurities attached onto the surface of the wafer after the ion implantation are physically removed. Thus, organic substances and particles which cannot be removed by the usually performed RCA cleaning or organic-substance removing and cleaning can be thoroughly removed, and surface roughness caused in the ion implantation step can be improved by polishing.

Chemical cleaning after physical removal (CMP) can lower the chemical solution concentration, so as to reduce surface roughness than the prior art.

The cause of void failure can be thoroughly removed to enhance product yield.

What is claimed is:

1. A method for manufacturing a bonded wafer comprising:
    implanting at least one of hydrogen ions and rare gas ions from a surface of a first wafer to form a micro bubble layer in the first wafer;
    physically removing impurities attached onto the surface of the first wafer to which the ions are implanted; and
    separating the first wafer in a thin-film form at said micro bubble layer by adding heat treatment to the surface of the first wafer subjected to the removal of impurities in close contact with a surface of a second wafer.

2. The method for manufacturing a bonded wafer according to claim 1, wherein chemical and mechanical polishing or CMP is performed for physically removing impurities.

3. The method for manufacturing a bonded wafer according to claim 1, wherein said first wafer is a silicon wafer, and before implanting ions to the silicon wafer, a silicon oxide film is formed previously on the surface of the silicon wafer.

4. The method for manufacturing a bonded wafer according to claim 1, wherein said second wafer is a silicon wafer, and the silicon oxide film is formed previously on the surface of the silicon wafer closely contacted onto said first wafer.

5. The method for manufacturing a bonded wafer according to claim 2, wherein said first wafer is a silicon wafer, and before implanting ions to the silicon wafer, a silicon oxide film is formed previously on the surface of the silicon wafer.

6. The method for manufacturing a bonded wafer according to claim 2, wherein said second wafer is a silicon wafer, and the silicon oxide film is formed previously on the surface of the silicon wafer closely contacted onto said first wafer.

7. The method for manufacturing a bonded wafer according to claim 3, wherein said second wafer is a silicon wafer, and the silicon oxide film is formed previously on the surface of the silicon wafer closely contacted onto said first wafer.

8. The method for manufacturing a bonded wafer according to claim 5, wherein said second wafer is a silicon wafer, and the silicon oxide film is formed previously on the surface of the silicon wafer closely contacted onto said first wafer.

\* \* \* \* \*